United States Patent
Ngo et al.

(10) Patent No.: US 6,323,135 B1
(45) Date of Patent: Nov. 27, 2001

(54) METHOD OF FORMING RELIABLE CAPPED COPPER INTERCONNECTS/WITH HIGH ETCH SELECTIVITY TO CAPPING LAYER

(75) Inventors: Minh Van Ngo, Union City; Robin W. Cheung, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/207,672

(22) Filed: Dec. 9, 1998

(51) Int. Cl.[7] .................................................. H01L 21/302
(52) U.S. Cl. ..................... 438/740; 438/723; 438/724; 438/692; 438/704; 438/754; 427/579; 427/574; 427/563
(58) Field of Search .................................. 438/687, 637, 438/653, 700, 692, 704, 723, 724, 740, 754; 427/579, 574, 563

(56) References Cited

U.S. PATENT DOCUMENTS

| | | | |
|---|---|---|---|
| 5,447,887 | * | 9/1995 | Filipiak et al. ...................... 437/200 |
| 5,519,254 | * | 5/1996 | Tabara ................................. 257/751 |
| 5,693,563 | * | 12/1997 | Teong .................................. 437/190 |
| 5,948,700 | * | 9/1999 | Zheng et al. ......................... 438/694 |
| 6,071,809 | * | 6/2000 | Zhao ................................... 438/634 |

\* cited by examiner

*Primary Examiner*—Gregory Mills
*Assistant Examiner*—George Goudreau

(57) ABSTRACT

The selectivity of an etchant to a capping layer in a Cu or Cu alloy interconnect member is significantly enhanced by providing a dielectric layer thereon with a faster etch rate. Embodiments include forming the dielectric layer with a faster etch rate by PECVD: (a) at a low frequency bias of about 0.1 kW or greater; (b) at a temperature of about 250° C. or greater; or (c) at a pressure greater than about 2.6 Torr.

15 Claims, 1 Drawing Sheet

US 6,323,135 B1

METHOD OF FORMING RELIABLE CAPPED COPPER INTERCONNECTS/WITH HIGH ETCH SELECTIVITY TO CAPPING LAYER

TECHNICAL FIELD

The present invention relates to copper (Cu) or Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate due to integrated circuit speed delays imposes a significant impediment to production throughput and increases manufacturing costs.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al in VLSI interconnect metallizations. Cu exhibits superior electromigration properties and has a lower resistivity than Al. In addition, Cu has improved electrical properties vis-a-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electro deposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are, however, significant problems attendant upon the use of conventional Cu or Cu alloy interconnect methodology. For example, conventional practices comprise forming a damascene opening in a dielectric interlayer, depositing a barrier layer such as TaN, filling the opening with Cu or a Cu alloy layer, CMP and forming a capping layer on the exposed surface of the Cu or Cu alloy, depositing an insulator layer, commonly referred to as an ILD (inter-level dielectric), such as silicon dioxide, and forming an opening by etching, such as wet etching, in the ILD to interconnect a further metal level. It was found, however, that the underlying capping layer provides poor etch stop control and is overetched by the etchant. As a result, the Cu or Cu alloy is exposed, and readily diffuses through the ILD into silicon elements, thereby adversely affecting device performance and decreasing the electromigration resistance of the Cu or Cu alloy interconnect member.

As design rules extend deeper into the submicron range, e.g., about 0.18 microns and under, the reliability of the interconnect pattern becomes particularly critical. Accordingly, the selectivity of the etchant with respect to the capping layer is required to be greater.

There exists a need for methodology enabling the formation of Cu and Cu alloy interconnect members having high reliability, high yield, and performance. There exists a particular need for improving the selectivity of the etch process with respect to the capping layer in Cu and Cu alloy interconnect members.

DISCLOSURE OF THE INVENTION

An advantage of the present invention is a method of manufacturing a semiconductor device having highly reliable Cu and Cu alloy interconnect members with high production throughout.

Another advantage of the present invention is a method of manufacturing a semiconductor device comprising a Cu or Cu alloy interconnect member which substantially minimizes erosion of an underlying capping layer.

Additional advantages and other features of the present invention will be set forth in the description which follows, and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising forming a copper (Cu) or Cu alloy layer forming a capping layer on the Cu or Cu alloy layer; forming a dielectric layer on the capping layer by plasma-enhanced chemical vapor deposition (PECVD); and controlling deposition conditions such that the deposited dielectric layer has an etch rate faster than an etch rate of the capping layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
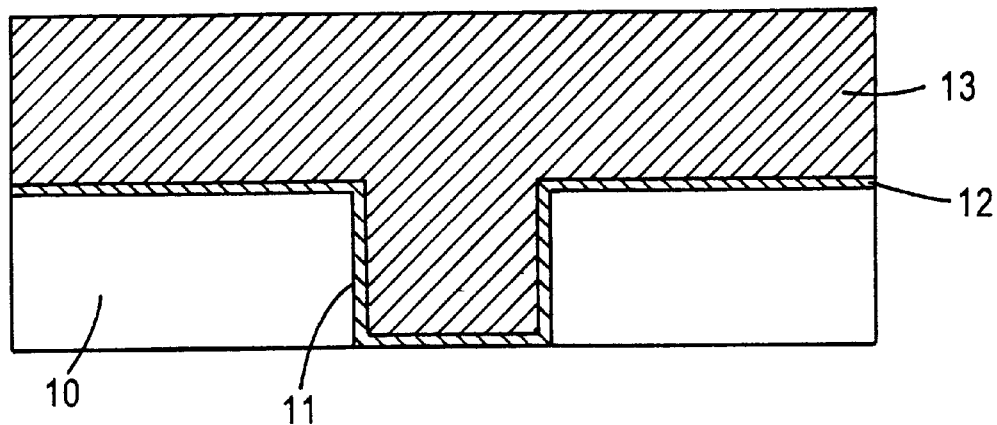
FIGS. 1–2 illustrate sequential phases of a method in accordance with an embodiment of the present invention.

The present invention addresses and solves problems attendant upon capping a Cu or Cu alloy interconnect, as with a capping layer of silicon nitride. Specifically, the present invention, eliminates or substantially reduces overetching of the capping layer caused by poor etchant selectivity, thereby preventing copper diffusion, and enhancing electromigration resistance.

As design rules are scaled down into the deep submicron range, e.g., about 0.18 micron and under, the reliability of encapsulated Cu and Cu alloy interconnect members becomes increasingly significant. It was found that conventional practices of forming a Cu or Cu alloy interconnect member in an opening, such as a damascene opening, result in overetching of the capping layer causing exposure of the underlying Cu or Cu alloy. Consequently, the Cu or Cu is redeposited, resulting in copper diffusion and increased electromigration as a result of such copper diffusion. The present invention constitutes an improvement over conventional practices in forming a dielectric layer on the deposited capping layer. Upon forming subsequent metallization levels, etching is allowed to continue past the dielectric layer for an overetch period necessary to compensate for any etch rate nonuniformity and fluctuations in film thickness. The present invention substantially addresses and minimizes the deleterious effect of conventional overetching by strategically increasing the etch rate of the dielectric layer. In accordance with embodiments of the present invention, parameters of plasma-enhanced chemical vapor deposition (PECVD) are controlled during deposition of the dielectric layer on the capping layer such that the deposited dielectric layer has a lower density than that of dielectric layers obtained by conventional PECVD. Consequently, the dielectric layer formed by the inventive method has an etch rate faster than the etch rate of the capping layer. Formation of a less dense dielectric layer with an etch rate greater than that of the underlying capping layer permits a faster etch of the dielectric layer and better etch stop control.

Embodiments of the present invention include forming the dielectric layer with an etch rate greater than about 280 Å/min, such as about 290 Å/min to about 500 Å/min, e.g., about 300 Å/min to about 390 Å/min. These etch rates are calculated as $(T_1 \text{ Å} - T_2 \text{ Å})/\text{time-minutes}$, where $T_2$=thickness of dielectric layer after dipping, $T_1$=thickness of dielectric before dipping, in 40:1 buffered oxide etch (BOE).

The exact mechanism involved in enhancing the selectivity of an etchant to the capping layer by virtue of employing the PECVD conditions to form the dielectric layer is not known with certainty. However, it is believed that controlling various deposited conditions, e.g., the use of the temperature and/or pressure, increases the deposition rate, thereby decreasing the density of the deposited dielectric layer by lowering the compressive stress of the layer. It is further believed that the use of the lower low frequency bias power lowers the ion bombardment energy during deposition, similarly decreasing the density of the deposited dielectric layer by lowering compressive stress.

Cu or Cu alloy interconnect members formed in accordance with the present invention can be, but are not limited to, interconnects formed employing damascene technology. Thus, embodiments of the present invention include forming a dielectric interlayer overlying a substrate, forming an opening, e.g., a damascene opening, in the dielectric layer, depositing a diffusion barrier layer, such as TaN, and filling the opening with Cu or a Cu alloy layer. Advantageously, the opening in the dielectric interlayer can be filled by initially depositing a seed layer and then electroplating or electroless plating the Cu or Cu alloy layer. CMP is then performed such that the upper surface of the Cu or Cu alloy layer is substantially coplanar with the upper surface of the dielectric interlayer. A capping layer, such as silicon nitride, is then deposited in accordance with conventional methodology.

In accordance with embodiments of the present invention, the dielectric layer can be formed on the capping layer by PECVD at a pressure greater than about 2.6 Torr, such as from about 2.7 Torr to about 3.0 Torr; by PECVD at a low frequency bias power of about 0.1 kW or greater such as from about 0.1 to about 0.25 kW; or by PECVD at a temperature of about 250° C. or greater, such as from about 250° to about 300° C. Given the stated objective, one having ordinary skill in the art can easily optimize other PECVD process parameters in, for example, a Novellus Concept I system for a given situation, e.g., for a particular metal, geometry and etching chemistry.

In the various embodiments of the present invention, conventional substrates, barrier layers and capping layers can be employed. For example, the substrate can be doped monocrystalline silicon or gallium-arsenide. The openings formed in dielectric layers can be formed by conventional photolithographic and etching techniques. The conditions under which a capping layer, such as silicon nitride, are formed are conventional and, hence, not elaborated upon herein.

Figure 2:
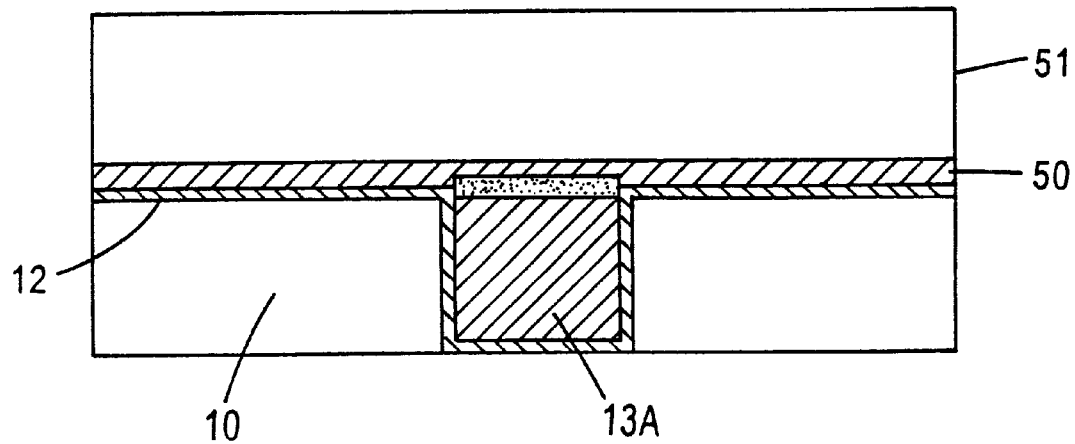

An embodiment of the present invention is schematically illustrated in FIGS. 1–2, wherein similar reference numerals denote similar features. Adverting to FIG. 1, damascene opening 11, such as a contact or via hole, is formed in dielectric layer 10, e.g., silicon dioxide, such as by wet etching. Wet etching can be performed by immersing the wafer in an appropriate solution or by spraying the wafer with the etchant solution. It should be understood that opening 11 can also be formed as a dual damascene opening comprising a contact or via hole section in communication with a trench section. A barrier layer 12 is deposited, such as TaN. Cu or Cu alloy layer 13 is then deposited. Upon electroplating or electroless plating layer 13, a seed layer (not shown) is deposited on barrier layer 12. The portions of the Cu or Cu alloy layer 13 extending beyond opening 11 are removed, as by CMP.

As shown in FIG. 2, a capping layer 50, such as silicon nitride, is then formed in a conventional manner completely encapsulating the Cu or Cu alloy interconnect 13A. Another dielectric layer or interlayer 51, such as silicon dioxide, is deposited by PECVD. During such PECVD, deposition conditions are controlled such that the deposited dielectric layer or interlayer 51 has an etch rate faster than the etch rate of the capping layer 50. In this way, a plurality of dielectric interlayers and metallization patterns are built up on a semiconductor substrate and various interconnects are formed.

The present invention enables the formation of extremely reliable Cu or Cu alloy interconnect members by providing strategically reducing the density of a dielectric layer deposited on a capping layer, thereby enhancing the selectivity of the etchant to the capping layer. Consequently, the present invention advantageously reduces overetching, minimizes erosion of the underlying Cu or Cu alloy, reduces copper diffusion and enhances electromigration resistance. The enhancement of the selectivity of the etchant with respect to the capping layer in accordance with the present invention significantly improves the reliability of the Cu or Cu alloy interconnect member with an attendant improvement in device reliability and performance, increases in production throughputs.

The present invention enjoys industrial applicability in the formation of various types of inlaid Cu and Cu alloy metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:

forming a copper (Cu) or Cu alloy layer;

depositing a silicon nitride capping layer on the Cu or Cu alloy layer;

forming a dielectric layer on the capping layer by plasma-enhanced chemical vapor deposition (PECVD); and controlling deposition conditions such that the deposited dielectric layer has an etch rate faster than an etch rate of the capping layer.

2. The method according to claim 1, wherein the etch rate of the dielectric layer is faster than about 280 Å/min.

3. The method according to claim 2, wherein the etch rate of the dielectric layer is about 290 Å/min to about 500 Å/min.

4. The method according to claim 3, wherein the etch rate of the dielectric layer is about 300 Å/min to about 390 Å/min.

5. The method according to claim 1, comprising:

forming the dielectric layer by PECVD at a low frequency bias power of about 0.1 kW or greater.

6. The method according to claim 5, comprising:

forming the dielectric layer by PECVD at a low frequency bias power of about 0.1 to about 0.25 kW.

7. The method according to claim 1, comprising:

forming the dielectric layer by PECVD at a temperature of about 250° or greater.

8. The method according to claim 7, comprising:

forming the dielectric layer by PECVD at a temperature of about 250 to about 300° C.

9. The method according to claim 1, comprising:

forming the dielectric layer by PECVD at a pressure greater than about 2.6 Torr.

10. The method according to claim 9, comprising:

forming the dielectric layer by PECVD at a pressure of about 2.7 Torr to about 3.0 Torr.

11. The method according to claim 1, comprising:

forming the dielectric layer by depositing silicon oxide.

12. The method according to claim 1, further comprising:

forming a dielectric layer overlying a substrate;

forming an opening in the dielectric layer;

depositing the Cu or Cu alloy layer in the opening and over the dielectric layer.

13. The method according to claim 12, comprising:

depositing a barrier layer before forming the Cu or Cu alloy layer.

14. The method according to claim 1, comprising:

forming the Cu or Cu alloy layer by:
 depositing a seed layer; and
 depositing the Cu or Cu alloy layer on the seed layer by electroplating or electroless plating.

15. The method according to claim 12 wherein the opening further comprises a via or contact hole section communicating with a trench section.

* * * * *

UNITED STATES PATENT AND TRADEMARK OFFICE
CERTIFICATE OF CORRECTION

PATENT NO.    : 6,323,135 B1
DATED         : November 27, 2001
INVENTOR(S)   : Minh Van Ngo et al.

It is certified that error appears in the above-identified patent and that said Letters Patent is hereby corrected as shown below:

<u>Column 7,</u>
Line 5, after "dielectric layer", insert
-- , and
Removing any portion of the Cu or Cu alloy layer beyond the opening by chemical mechanical polishing so that an upper surface of the Cu or Cu alloy layer is substantially coplanar with an upper surface of the dielectric layer --.

Signed and Sealed this

Fifteenth Day of June, 2004

JON W. DUDAS
*Acting Director of the United States Patent and Trademark Office*